(12) United States Patent
Lai et al.

(10) Patent No.: US 12,400,976 B2
(45) Date of Patent: Aug. 26, 2025

(54) SEAL STRUCTURES

(71) Applicant: Taiwan Semiconductor Manufacturing Company, Ltd., Hsin-Chu (TW)

(72) Inventors: Yen Lian Lai, Taipei (TW); Chun Yu Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 591 days.

(21) Appl. No.: 17/737,768

(22) Filed: May 5, 2022

(65) Prior Publication Data

US 2023/0030448 A1 Feb. 2, 2023

Related U.S. Application Data

(60) Provisional application No. 63/227,189, filed on Jul. 29, 2021.

(51) Int. Cl.
*H01L 23/58* (2006.01)
*H01L 23/00* (2006.01)
(Continued)

(52) U.S. Cl.
CPC .......... *H01L 23/585* (2013.01); *H01L 23/562* (2013.01); *H10D 30/6735* (2025.01); *H10D 30/6757* (2025.01); *H10D 62/118* (2025.01)

(58) Field of Classification Search
CPC .......... H10D 30/6735; H10D 30/6757; H10D 62/118; H10D 84/0158; H10D 30/0243; H10D 30/62; H10D 84/038; H10D 84/834; H10D 84/0151; H01L 21/823456; H01L 27/088; H01L 29/0673; H01L 29/42392;

(Continued)

(56) References Cited

U.S. PATENT DOCUMENTS

2015/0255593 A1* 9/2015 Yu ...................... H01L 27/0886
257/401
2021/0305386 A1* 9/2021 Hsiao ................... H10D 64/518

FOREIGN PATENT DOCUMENTS

TW 201535729 A 9/2015

OTHER PUBLICATIONS

Chun Yu Chen et al. "Seal Structures" U.S. Appl. No. 17/465,556, filed Sep. 2, 2021, Assignee Taiwan Semiconductor Manufacturing Company, Ltd, 32 Sheets of Specification, 13 Sheets of Drawings.

* cited by examiner

*Primary Examiner* — Andres Munoz
*Assistant Examiner* — Ashley Nicole Blackwell
(74) *Attorney, Agent, or Firm* — HAYNES AND BOONE, LLP

(57) ABSTRACT

A semiconductor structure includes a device region and a seal structure surrounding the device region. The seal structure includes an outer ring surrounding the device region and a buffer region disposed between the outer ring and the device region. The buffer region includes a first portion having a number of first gate structures extending lengthwise along a first direction and a second portion having a number of second gate structures extending lengthwise along the first direction. The second portion of the buffer region is disposed between the first portion of the buffer region and the outer ring. Along a second direction that is substantially perpendicular to the first direction, a width of each of the first gate structures is greater than a width of each of the second gate structures.

20 Claims, 14 Drawing Sheets

(51) Int. Cl.
  *H10D 30/67* (2025.01)
  *H10D 62/10* (2025.01)
(58) Field of Classification Search
  CPC ............ H01L 29/775; H01L 29/78696; H01L 27/0886; H01L 29/6681; H01L 21/823431
  See application file for complete search history.

SEAL STRUCTURES

PRIORITY DATA

This application claims priority to U.S. Provisional Patent Application Ser. No. 63/227,189, filed Jul. 29, 2021, entitled "Seal Ring Structures," the entire disclosure of which is incorporated herein by reference.

BACKGROUND

In semiconductor technologies, a semiconductor wafer is processed through various fabrication steps to form integrated circuits (IC). Typically, several functional ICs are fabricated on the same semiconductor wafer. The wafer is then diced into dies, each of which includes a functional IC. To protect semiconductor devices in the functional IC from moisture degradation, ionic contamination, and dicing processes, a seal structure is formed around each functional IC. This seal structure is formed during fabrication of a multi-layer structure that includes semiconductor devices and interconnect structures that route electrical signals among the semiconductor devices. The fabrication process generally includes the front-end-of-line (FEOL) processing and back-end-of-line processing (BEOL). The FEOL processing includes formation of semiconductor devices such as transistors, capacitors, diodes, and/or resistors onto the semiconductor substrate. The BEOL processing includes formation of interconnect structures that includes metal lines and contact vias. While existing seal structures are generally adequate in for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
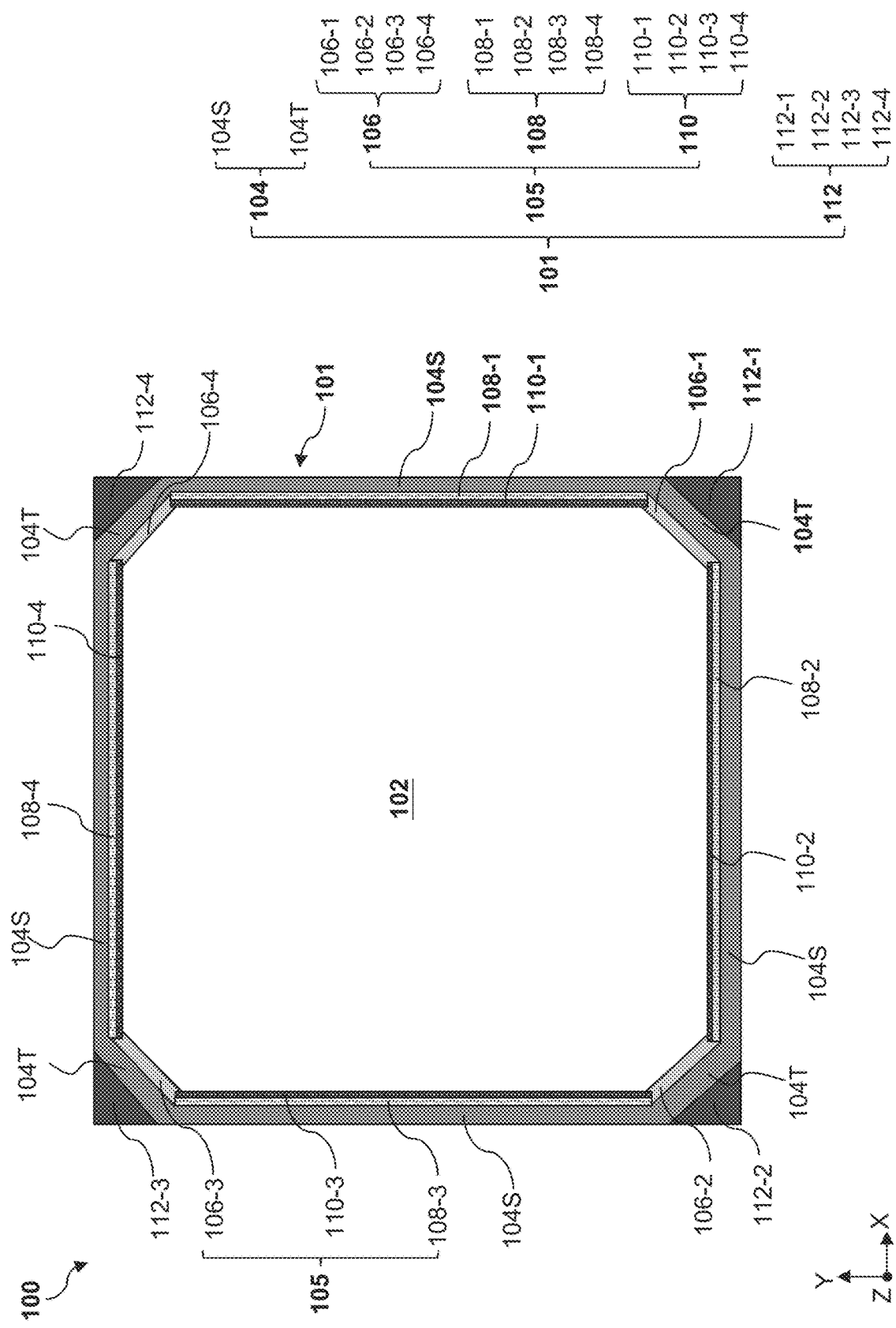
FIG. 1 illustrates a top view of an exemplary semiconductor structure that includes a device region and a seal structure around the device region, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed. For avoidance of doubts, the X, Y and Z directions in figures of the present disclosure are perpendicular to one another. Throughout the present disclosure, like reference numerals denote like features, unless otherwise excepted.

An IC chip may include a device region that includes a functional IC. In the course of IC evolution, functional density (i.e., the number of interconnected devices per chip area) has generally increased while geometry size (i.e., the smallest component (or line) that can be created using a fabrication process) has decreased. As integrated circuit technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Due to the scaling down, the structures of the FinFETs or MBC transistors may be susceptible to damages due to, for example, mist ingress or stress during singulation. Seal structures have been implemented to protect components in the device region. Typically, the seal structure includes a seal ring that completely surrounds the device region. While features (e.g., source/drain contacts, gate structures) in the device region may be scaled down to increase the functional density, features (e.g., source/drain contacts, gate structures) in the seal ring may be intentionally configured to have large sizes (e.g., length, width) such that the seal ring may protect the device region against damages due to external stress. In addition, a relatively large size of the gate structures in the seal ring provides enhanced mechanical strength to further increase the reliability of the IC chip. However, since features such as gate structures in the device region continue to scale down, the pattern density of gate structures in the device region increases, leading to an increased difference between a pattern density of the gate structures in the device region and a pattern density of the gate structures in the seal ring. Such an increased pattern density difference may lead to, for example, chemical mechanical polish (CMP) loading effect and defects. It is noted that the pattern densities of source/drain contacts in the device region and in the seal ring exhibit similar trends (i.e., increased pattern density difference) as well. The comparison between the pattern densities of the gate structures in different regions is for illustration purposes only and not intended to limit the present disclosure to gate structure embodiments.

The present disclosure provides a semiconductor structure that includes a device region and a composite seal structure surrounding the device region. The composite seal structure includes a buffer region and a seal ring surrounding the buffer region, where the buffer region is disposed between the device region and the seal ring. Since the buffer region is disposed closer to the device region, the seal ring that is disposed further away from the device region may be referred to as an outer ring. A pattern density of gate structures in the buffer region is greater than a pattern density of gate structures in the outer ring such that the pattern density difference between the device region and the seal structure is reduced. The buffer region includes an inner portion having a number of segmented first gate structures extending lengthwise along a first direction and an outer portion having a number of segmented second gate structures extending lengthwise along the first direction. The outer portion is disposed between the inner portion and the outer ring. The outer ring includes a number of third gate structures continuously surrounding the device region. Along a second direction that is substantially perpendicular to the first direction, a gate width of each of the first gate structures is greater than a gate width of each of the second gate structures and smaller than a gate width of each of the third gate structures.

Reference is first made to FIG. 1, which is a top view of a semiconductor structure 100. The semiconductor structure 100 includes a device region 102 and a composite seal structure 101 surrounding the device region 102. The composite seal structure 101 includes a seal ring 104 ("outer ring 104") continuously surrounding the device region 102. In embodiments represented in FIG. 1, the seal ring 104 includes portions extending along the X direction, portions extending along the Y direction, and portions extending along directions that transition from X direction to Y direction or vice versa. For reason of simplicity, each of the portions of the seal ring 104 extending along the X direction or Y direction may be referred to as a straight portion 104S, and each portion of the rest of the seal ring 104 may be referred to as a turning portion 104T. In embodiments represented in FIG. 1, the seal ring 104 includes four straight portions 104S and four turning portions 104T. For ease of reference, one or more of the four straight portions 104S and four turning portions 104T may be collectively or respectively referred to as the seal ring 104 as the context requires. The seal structure 101 also includes outer corner areas 112 disposed at outer corners of the turning portions 104T. The outer corner areas 112 include four outer corner areas 112-1, 112-2, 112-3, and 112-4. For ease of reference, one or more of the four outer corner areas 112-1, 112-2, 112-3, and 112-4 may be collectively or respectively referred to as outer corner areas 112 or an outer corner area 112 as the context requires.

As described above, features (e.g., gate structures) in the device region 102 may have smaller dimensions to increase the functional density of the device region 102 and features (e.g., gate structures) in the seal ring 104 may have large dimensions to withstand stress and protect the device region 102. In the present disclosure, the seal structure 101 includes a buffer region 105 disposed between the device region 102 and the seal ring 104 to reduce a difference between a pattern density of gate structures in the device region 102 and a pattern density of gate structures in the seal structure 101. As exemplary shown in FIG. 1, the buffer region 105 includes inner corner areas 106 disposed at inner corners of the turning portion 104T of the seal ring 104. The inner corner areas 106 include four inner corner areas 106-1, 106-2, 106-3, and 106-4. For ease of reference, one or more of the four inner corner areas 106-1, 106-2, 106-3, and 106-4 may be respectively or collectively referred to as an inner corner area 106 or inner corner areas 106 as the context requires. The buffer region 105 also includes first buffer portions 110 and second buffer portions 108 disposed at inner side of the straight portions 104S. The first buffer portions 110 are disposed adjacent to the device region 102 and the second buffer portions 108 are spaced apart from the device region 102 by the first buffer portions 110. The first buffer portions 110 include four first buffer portions 110-1, 110-2, 110-3, and 110-4. For ease of reference, one or more of the four first buffer portions 110-1, 110-2, 110-3, and 110-4 may be respectively or collectively referred to as a first buffer portion 110 or first buffer portions 110 as the context requires. The second buffer portions 108 include four second buffer portions 108-1, 108-2, 108-3, and 108-4. For ease of reference, one or more of the second buffer portions 108-1, 108-2, 108-3, and 108-4 may be respectively or collectively referred to as a second buffer portion 108 or second buffer portions 108 as the context requires.

Figure 9:
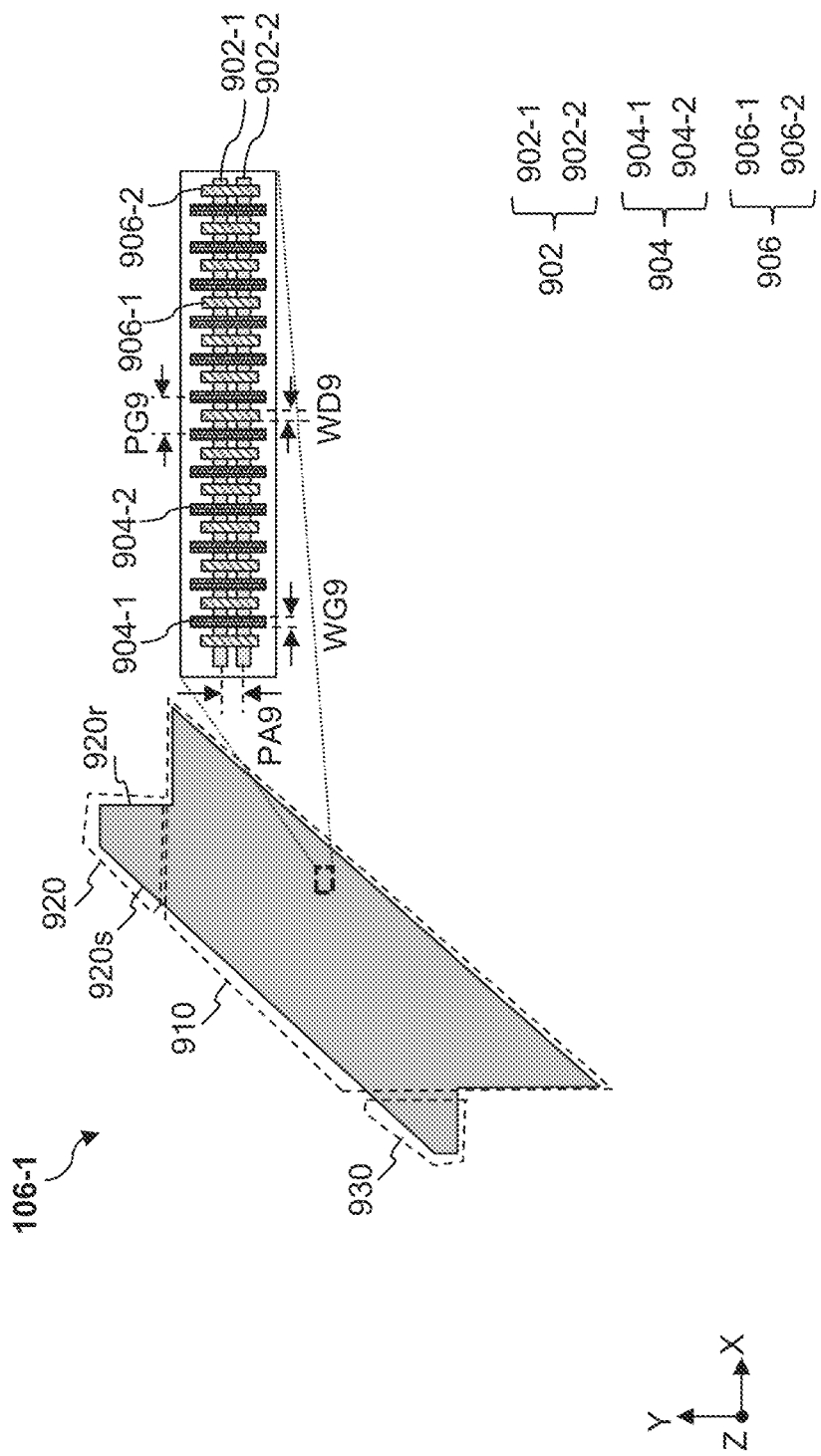
FIG. 9 illustrates an enlarged fragmentary top view of an inner corner area of the seal structure of the semiconductor structure in FIG. 1, according to one or more aspects of the present disclosure.

The semiconductor structure 100 may be rectangular in shape when viewed along the Z direction. In embodiments represented in FIG. 1, a top view of the semiconductor structure 100 is square in shape, a top view of the seal ring 104 resembles an octagon shape. Each of the inner corner areas 106 and the outer corner areas 112 may have one edge parallel to one edge/side of the turning portion 104T of the seal ring 104. Each of the first buffer portions 110 and the second buffer portions 108 have two edges parallel to one edge/side of the straight portion 104S of the seal ring 104. In these embodiments, as shown in FIG. 1, each of the first buffer portions 110 and the second buffer portions 108 resemble a rectangle. Each of the outer corner areas 112 resembles a right triangle. An enlarged top view of the inner corner area is shown in FIG. 9.

Figure 2:
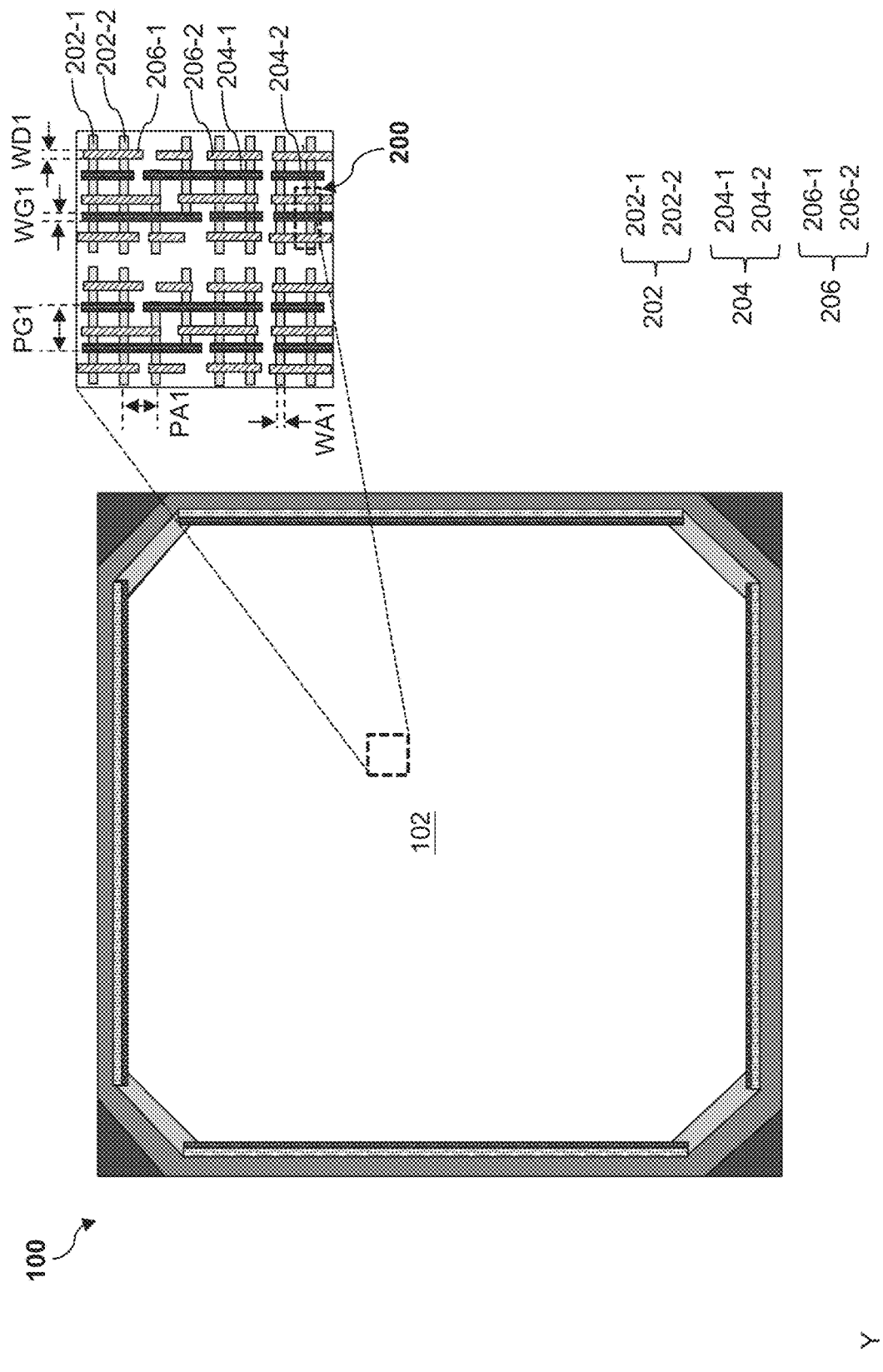
FIG. 2 illustrates an enlarged fragmentary top view of the device region of the semiconductor structure in FIG. 1, according to one or more aspects of the present disclosure.

FIG. 2 illustrates an enlarged fragmentary top view of the device region 102. The device region 102 may include logic devices, memory devices, and/or input/output (I/O) devices. The logic devices may include, for example, inverters, AND gates, OR gates, NAND gates, NOR gates, XNOR gates, XOR gates, and NOT gates. The memory devices may include static random-access memory (SRAM) devices. In embodiments represented in FIG. 2, the device region 102 includes segmented active regions 202 extending lengthwise along the X direction, segmented gate structures 204 extending lengthwise along the Y direction, and segmented source/drain contacts 206 extending lengthwise along the Y direction. The segmented active regions 202, the segmented gate structures 204, and the segmented source/drain contacts 206 are segmented such that the device region 102 can perform intended functions. If the segmented active regions 202, the segmented gate structures 204, and the segmented source/drain contacts 206 are not segmented as representatively shown in FIG. 2 and are allowed to extend continuously throughout the X direction and Y direction, the device region 102 would not be able to perform its intended functions. For example, when the segmented gate structures 204 are not segmented, all transistors disposed along the Y direction may be controlled by a common signal applied to the gate structure 204. For another example, when the segmented source/drain contacts 206 are not segmented, all source/drain features disposed along the Y direction would be connected in parallel. Put differently, the segmented active regions 202 do not extend continuously across the device region 102 along the X direction; the segmented gate structures 204 do not extend continuously across the device region 102 along the Y direction; and the segmented source/drain contacts 206 do not extend continuously across the device region 102 along the Y direction.

The segmented active regions 202 may have same or different lengths along the X direction. In the depicted embodiments, the segmented active regions 202 include a segmented active region 202-1 and a segmented active region 202-2. The segmented active region 202-1 has a length identical to a length of the segmented active region 202-2. The segmented gate structures 204 may have same or different lengths along the Y direction and same or different widths along the X direction. That is, the segmented gate structures 204 may not be segmented uniformly. For example, the segmented gate structures 204 include a segmented gate structure 204-1 and a segmented gate structure 204-2, and the segmented gate structure 204-1 has a length greater than a length of the segmented gate structure 204-2. The segmented active regions 202, although having different lengths along the X direction, are disposed at an active region pitch PA1 along the Y direction. The segmented gate structures 204, although having different lengths along the Y direction, are disposed at a gate pitch PG1 along the X direction. Each of the segmented active regions 202 has an active region width WA1. IC chips designed for different applications may be configured to perform different functions and may have different functional densities. For example, a first IC chip implemented in a mobile device may have a higher functional density than that of a second IC chip implemented in a powertrain control module. Thus, a gate width (along the X direction) of the gate structures in the first IC chip may be smaller than a gate width of the gate structures in the second IC chip. In embodiments represent in FIG. 2, a gate width WG1 of the gate structure 204 is between a minimum gate width WGmin and a maximum gate width WGmax. Here, the minimum gate width WGmin may be referred to as the smallest dimension of a gate width that can be achieved by current fabrication processes. For example, the minimum gate width WGmin may be between about 1 nm and about 5 nm. The maximum gate width WGmax may be referred to as an acceptable maximum gate width in the device region 102. In some embodiments, WGmax may be about 10 to about 25 times of the WGmin. For example, WGmax may be between about 30 nm and about 70 nm. In some embodiments, the gate structures 204 have a uniform gate width WG1 ranged between about 1 nm and 70 nm. In an embodiment, each of the gate structures 204 has the gate width WG1 that is substantially equal to WGmin. That is, the gate width WG1 may be between about 1 nm and about 5 nm.

In embodiments represented in FIG. 2, the segmented gate structure 204-1 is disposed over four (4) segmented active regions 202 and the segmented gate structure 204-2 is disposed over two (2) segmented active regions 202. The segmented source/drain contacts 206 include a segmented source/drain contact 206-1 and a segmented source/drain contact 206-2. The segmented source/drain contact 206-1 has a length greater than a length of the segmented source/drain contact 206-2. That is, the segmented source/drain contacts 206 may not be segmented uniformly. In FIG. 2, the segmented source/drain contact 206-1 connects source/drain features over two segmented active regions 202 and the segmented source/drain contact 206-2 connects source/drain features over two segmented active region 202. Each of the segmented source/drain contacts 206 may have a source/drain contact width WD1 along the X direction. It is understood that the arrangement of the segmented active regions 202, the segmented gate structures 204, and the segmented source/drain contacts 206 shown in FIG. 2 is just an example and is not intended to limit present disclosure to what is explicitly illustrated therein.

Figure 3:
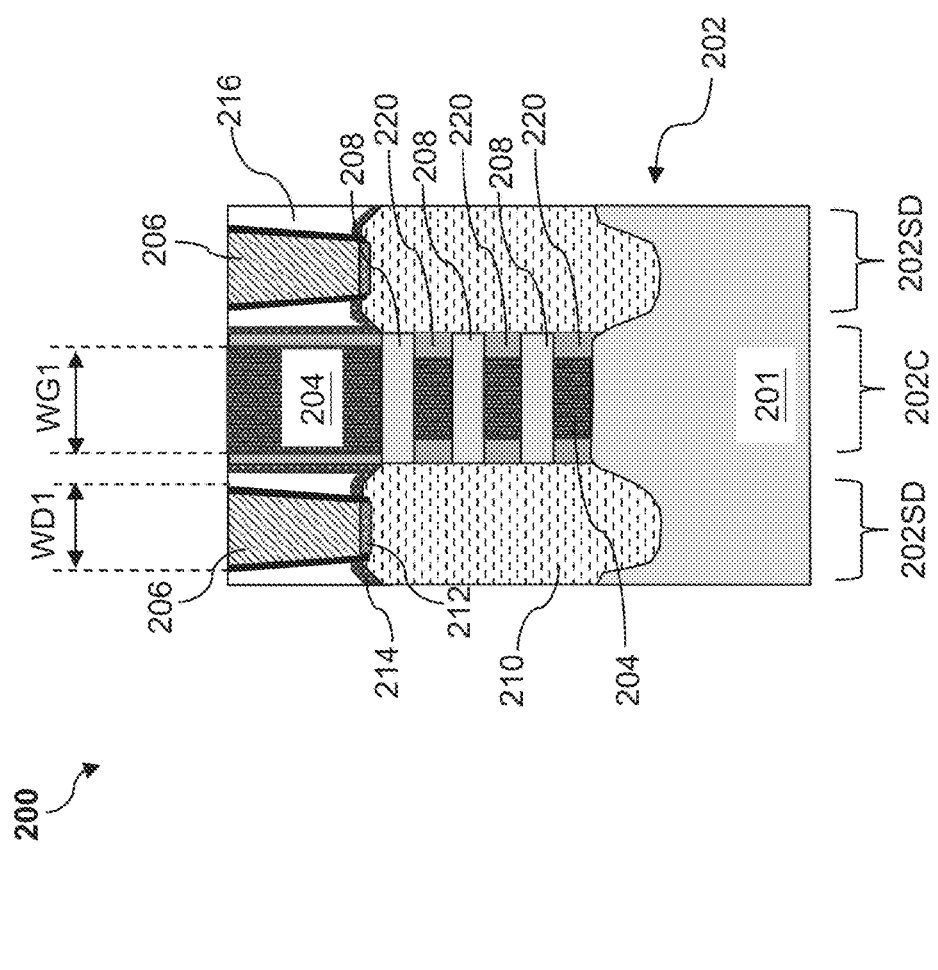
FIG. 3 illustrates a fragmentary cross-sectional view of a semiconductor device in the device region of the semiconductor structure in FIG. 1, according to one or more aspects of the present disclosure.

Reference is now made to FIG. 3, which illustrates a fragmentary cross-sectional view of a semiconductor device 200 in the device region 102. In the depicted embodiment, the semiconductor device 200 is an MBC transistor. The semiconductor device 200 includes a substrate 201. In an embodiment, the substrate 201 is a bulk silicon substrate (i.e., including bulk single-crystalline silicon). The substrate 201 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 201 may be a semiconductor-on-insulator substrate, such as a silicon-on-insulator substrate, a silicon germanium-on-insulator substrate, or a germanium-on-insulator substrate, and includes a carrier, an insulator on the carrier, and a semiconductor layer on the insulator.

Each of the segmented active regions 202 is formed in and over the substrate 201. As shown in FIG. 3, the segmented active region 202 of the semiconductor device 200 includes two source/drain regions 202SD and a channel region 202C disposed between two source/drain regions 202SD. In the channel region 202C, the segmented active region 202 includes a vertical stack of channel members 208 that extend along the X direction. The channel members 208 may include silicon or other suitable semiconductor materials. The channel members 208 may be referred to as nanostructures due to their nano-scale dimensions. Each source/drain feature 210 is disposed over a corresponding source/drain region 202SD. The source/drain features 210 are formed by epitaxial deposition of semiconductor materials such as silicon or silicon germanium and may be doped with an n-type dopant, such as phosphorus (P) or arsenic (As) or a p-type dopant, such as boron (B) or boron difluoride ($BF_2$).

The segmented gate structure 204 is disposed over the channel region 202C to wrap around each of the channel members 208. As shown in the FIG. 3, the segmented gate structure 204 is spaced apart from the source/drain features 210 by inner spacer features 220. The channel members 208 over the channel region 202C are vertically separated from one another by the inner spacer features 220. The inner spacer features 220 may include silicon nitride, silicon oxycarbonitride, silicon carbonitride, silicon oxide, silicon oxycarbide, silicon carbide, or silico oxynitride, or other suitable materials. The segmented gate structure 204 may include a gate dielectric layer and a gate electrode layer over the gate dielectric layer. In some embodiments, while not explicitly shown in the figures, the gate dielectric layer includes an interfacial layer and a high-k gate dielectric layer. High-k dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-k gate dielectric layer may include hafnium oxide. Alternatively, the high-k gate dielectric layer may include other high-k dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-k gate dielectric layer may be formed by ALD, physical vapor deposition (PVD), CVD, oxidation, and/or other suitable methods.

The gate electrode layer of the segmented gate structure 204 may include a single layer or alternatively a multi-layer structure, such as various combinations of a metal layer with a selected work function to enhance the device performance (work function metal layer), a liner layer, a wetting layer, an adhesion layer, a metal alloy, or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process.

Each of the segmented source/drain contacts 206 is disposed over a source/drain feature 210 and is electrically connected to the source/drain feature 210 by a silicide layer 212. Each of the source/drain contacts 206 may include a barrier layer and a metal filler layer disposed over the barrier layer. The barrier layer may include titanium nitride or tantalum nitride. The metal fill layer may include ruthenium (Ru), copper (Cu), nickel (Ni), cobalt (Co), or tungsten (W). The silicide layer 212 may include titanium silicide, tantalum silicide, cobalt silicide, nickel silicide, or tungsten silicide. The silicide layer interfaces the source/drain features 210 to reduce contact resistance.

Still referring to FIG. 3, the semiconductor device 200 also includes a contact etch stop layer (CESL) 214 disposed over the source/drain features 210 and an interlayer dielectric (ILD) layer 216 disposed over the CESL 214. In some examples, the CESL 214 includes silicon nitride, silicon oxynitride, and/or other materials known in the art. The ILD layer 216 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The source/drain contact 206 extends through the ILD layer 216 and the CESL 214 and is electrically coupled to the source/drain feature 210 by way of the silicide layer 212.

Figure 4:
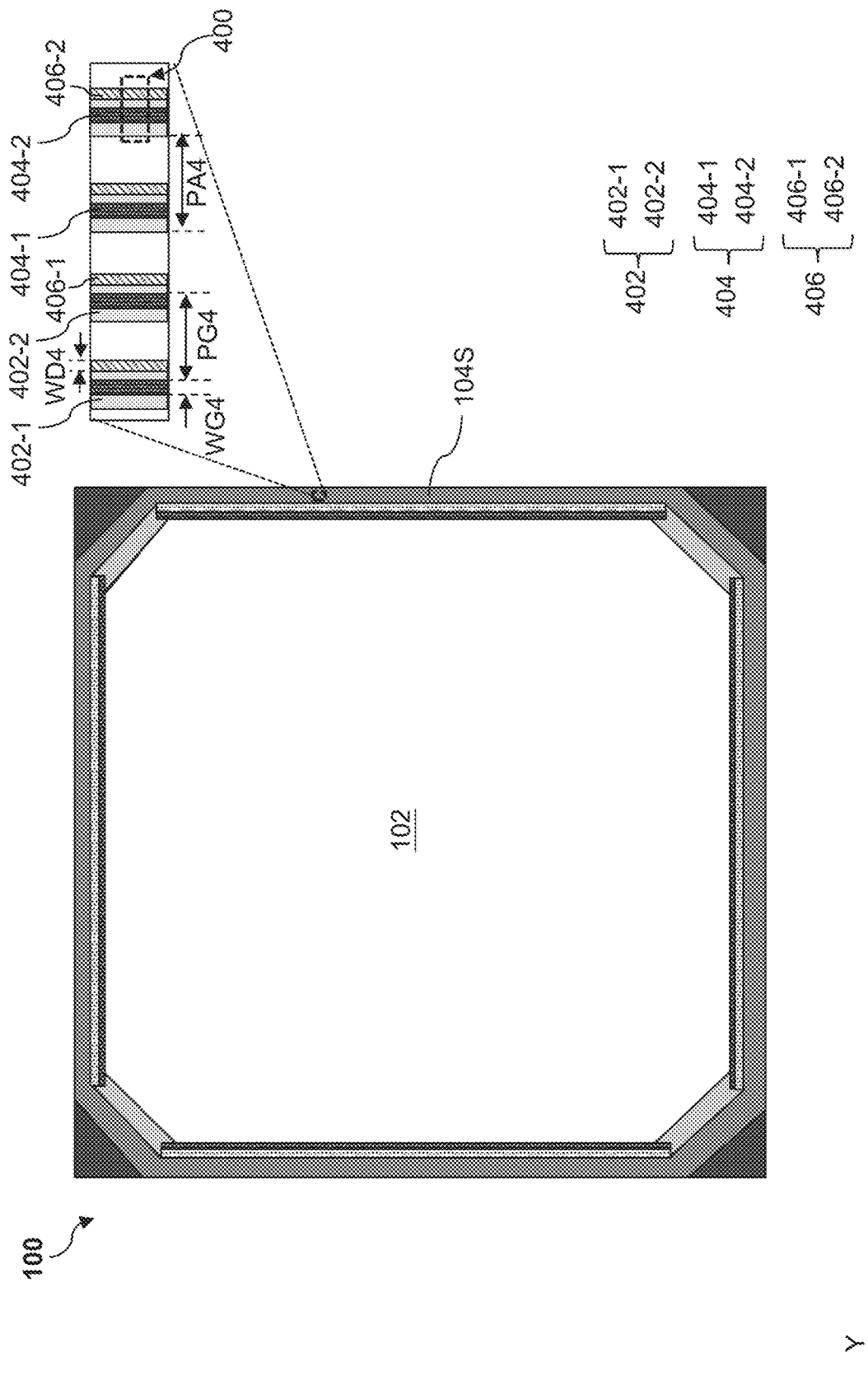
FIG. 4 illustrates an enlarged fragmentary top view of an outer ring of the seal structure of the semiconductor structure in FIG. 1, according to one or more aspects of the present disclosure.

Reference is then made to FIG. 4, which includes an enlarged fragmentary top view of the outer ring 104 of the seal structure 101, and more specifically, an enlarged fragmentary top view of the straight portion 104S that extends lengthwise along the Y direction. In embodiments represented in FIG. 4, the outer ring 104 includes active regions 402 (e.g., active regions 402-1 and 402-2) extending along a longitudinal direction (e.g., Y direction) of the outer ring 104, gate structures 404 (e.g., gate structures 404-1 and 404-2) extending along the longitudinal direction of the outer ring 104, source/drain contacts 406 (e.g., source/drain contacts 406-1and 406-2) extending along the longitudinal direction of the outer ring 104. That is, the active regions 402, the gate structures 404, and source/drain contacts 406 extend lengthwise along the same direction. Each of the source/drain contacts 406 is partially disposed directly over a corresponding active region of the active regions 402. The active regions 402 have an active region pitch PA4, the gate structures 404 have a gate pitch PG4, the source/drain contacts 406 have a source/drain contact width WD4, and each of the gate structures 404 has a gate width along the X direction. In this present embodiment, each of the gate structures 404 has a same gate width WG4.

Since the outer ring 104 of the seal structure 101 is configured to protect the device region 102 against damage by stress or mechanical attack from outside, dimensions of features in the outer ring 104 are greater than dimensions of those features in the device region 102. For example, dimensions of a semiconductor device 400 in the outer ring 104 are about 2 times to about 40 times of those of the semiconductor device 200 in the device region 102 (shows in FIGS. 2-3). For example, a ratio of the gate pitch PG4 to the gate pitch PG1 is between about 2 and about 40; a ratio of the active region pitch PA4 to the active region pitch PA1 is between about 2 and about 40; a ratio of the active region width WA4 to the active region width WA1 is between about 2 and about 40; a ratio of the contact width WD4 to the contact width WD1 is between about 2 and about 40; and a ratio of the gate width WG4 to the gate width WG1 is between about 2 and about 40. In an embodiment, the gate width WG4 of the gate structure 404 may be several times greater than the maximum gate width WGmax. For example, the gate width WG4 may be about 2 to 5 times greater than the maximum gate width WGmax. In an embodiment, the gate width WG4 may be between about 80 nm and about 120 nm. The large dimensions of the features in the outer ring 104 provide further benefits. For example, different from features in the fragmentary top view of the device region 102 that have segmented and smaller dimensions, due to the large dimensions in the outer ring 104, the active regions 402, the gate structures 404, and the source/drain contacts 406 may be fabricated to extend continuously to surround the device region 102 and surround the buffer region 105 (shown in FIG. 1) without substantially sacrificing the morphology of those active regions 402, the gate structures 404, and the source/drain contacts 406, thereby simplifying the fabrication process and increasing the reliability of the semiconductor structure 100.

Still referring to FIG. 4, the outer ring 104 includes a number of semiconductor devices 400. Each semiconductor device 400 includes two source/drain features coupled to a channel region, a gate structure 404, and a source/drain contact 406. Since the seal structure 101 and the device region 102 may be fabricated by common fabrication processes, while being different in shape and dimension, the compositions of the semiconductor device 400 may be in a way similar to those of the semiconductor device 200. Therefore, a detailed description of the compositions of the gate structures 404 and source/drain contacts 406 is omitted for reason of simplicity. As described above with reference to FIGS. 2-3, the device region 102 may include MBC transistors and the segmented active regions 202 include channel members 208 that are released by selective removal of silicon germanium sacrificial layers. Since the dimension of the active region 402 in the outer ring 104 is greater than that of the device region 102, to ensure the reliability of the MBC transistors in the device region 102, during the channel release process, silicon germanium layers in the channel region of the semiconductor device 400 will not be completely removed. That is, both the silicon layers and the silicon germanium layers remain in the channel region of the semiconductor device 400. It is noted that, to fulfill the intended functions, the semiconductor device 200 in the device region 102 may include two source/drain contacts 206. However, to form the large-dimension gate structures 404 and source/drain contacts 406 of the outer ring 104 in a limited real estate in the wafer while ensuring a satisfactory reliability, as shown in the FIG. 4, the semiconductor device 400 in the outer ring 104 only includes one source/drain contact 406 and only a portion of the source/drain contact 406 may be disposed directly on the active region 402.

Figure 5:
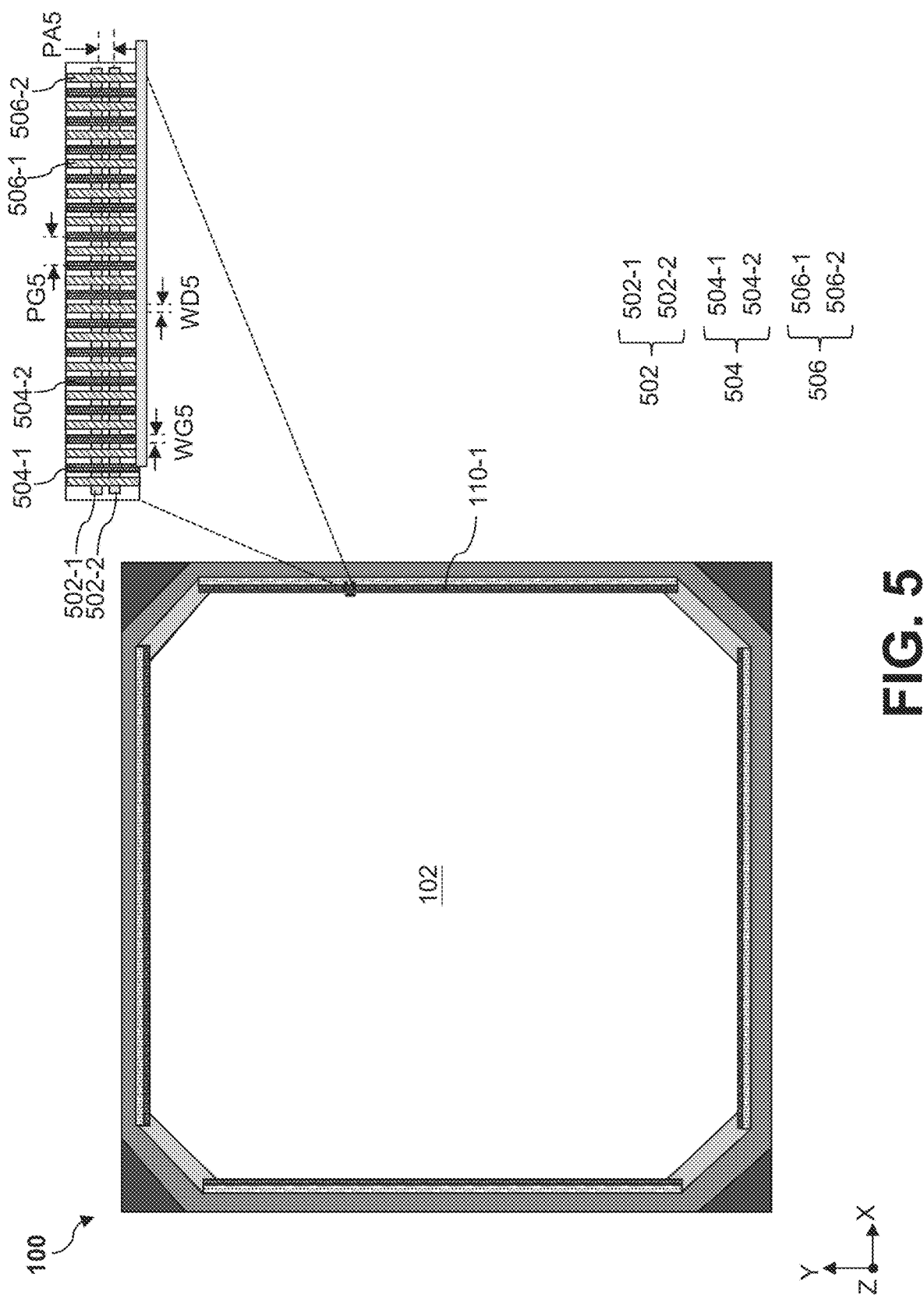
FIG. 5 illustrates an enlarged fragmentary top view of a first buffer portion of the seal structure of the semiconductor structure in FIG. 1, according to one or more aspects of the present disclosure.

Reference is then made to FIG. 5, which includes an enlarged fragmentary top view of the first buffer portion 110-1 in the buffer region 105. For illustration purposes, the first buffer portion 110-1 is shown in FIG. 5, and similar descriptions apply to the other three first buffer portions 110-2, 110-3 and 110-4. In embodiments represented in FIG. 5, the first buffer portion 110-1 includes active regions 502 (e.g., active regions 502-1 and 502-2) extending lengthwise along the X direction, gate structures 504 (e.g., gate structures 504-1 and 504-2) extending lengthwise along the Y direction, and source/drain contacts 506 (e.g., source/drain contacts 506-1 and 506-2) extending lengthwise along the Y direction. The active regions 502 have an active region pitch PA5 along the Y direction and the gate structures 504 have a gate pitch PG5 along the X direction. Each active region 502 has an active region width WA5 along the Y direction and each gate structure 504 has a gate width WG5 along the X direction. To provide a buffer between the device region 102 and the outer ring 104, the gate width WG5 is greater than or equal to the gate width WG1 (shown in FIG. 2) and is smaller than the gate width WG4 (shown in FIG. 4). That is, WG1≤WG5<WG4. In an embodiment, the gate width WG5 of the gate structure 504 is substantially equal to the maximum gate width WGmax and may be between about 30 nm and about 70 nm. The dimensional relationship among the gate pitches, dimensional relationship among source/drain contact widths and dimensional relationship among active region pitches in the device region 102, first buffer portion 110-1 and the outer ring 104 may be similar to the gate width relationship in the device region 102, first buffer portion 110-1 and the outer ring 104. That is, PG1≤PG5<PG4, WD1≤WD5<WD4, and PA1≤PA5<PA4.

Since devices formed in the first buffer portion 110-1 will not be used to form circuits, and due to the dimensions of the devices in the first buffer portion 110-1 and process limitations (e.g., photolithography limitations), the active regions 502, the gate structures 504, and the source/drain contacts 506 may be uniformly segmented. Detailed description of the segmentations of the gate structures 504 would be further described with reference to FIGS. 7-8. Besides the dimensional differences, the structure, and compositions of the semiconductor device in the first buffer portion 110-1 may be in a way similar to the semiconductor device 200 in the device region 102, descriptions related to a cross-sectional view of the semiconductor device and compositions of the semiconductor device in the first buffer portion 110-1 are omitted for reason of simplicity.

Although the first buffer portion 110-1 is arranged between the device region 102 and the outer ring 104 to isolate the device region 102 from the outer ring 104, features (e.g., gate structures) in the device region 102 continue to scale down, and there is still a large pattern density difference between gate structures 504 in the first buffer portion 110-1 and gate structures 204 in the device region 102. To increase the pattern density of the gate structures in the buffer region 105, the second buffer portion 108 that has a greater pattern density than the first buffer portion 110-1 is introduced and disposed between the first buffer portion 110-1 and the outer ring 104.

Figure 6:
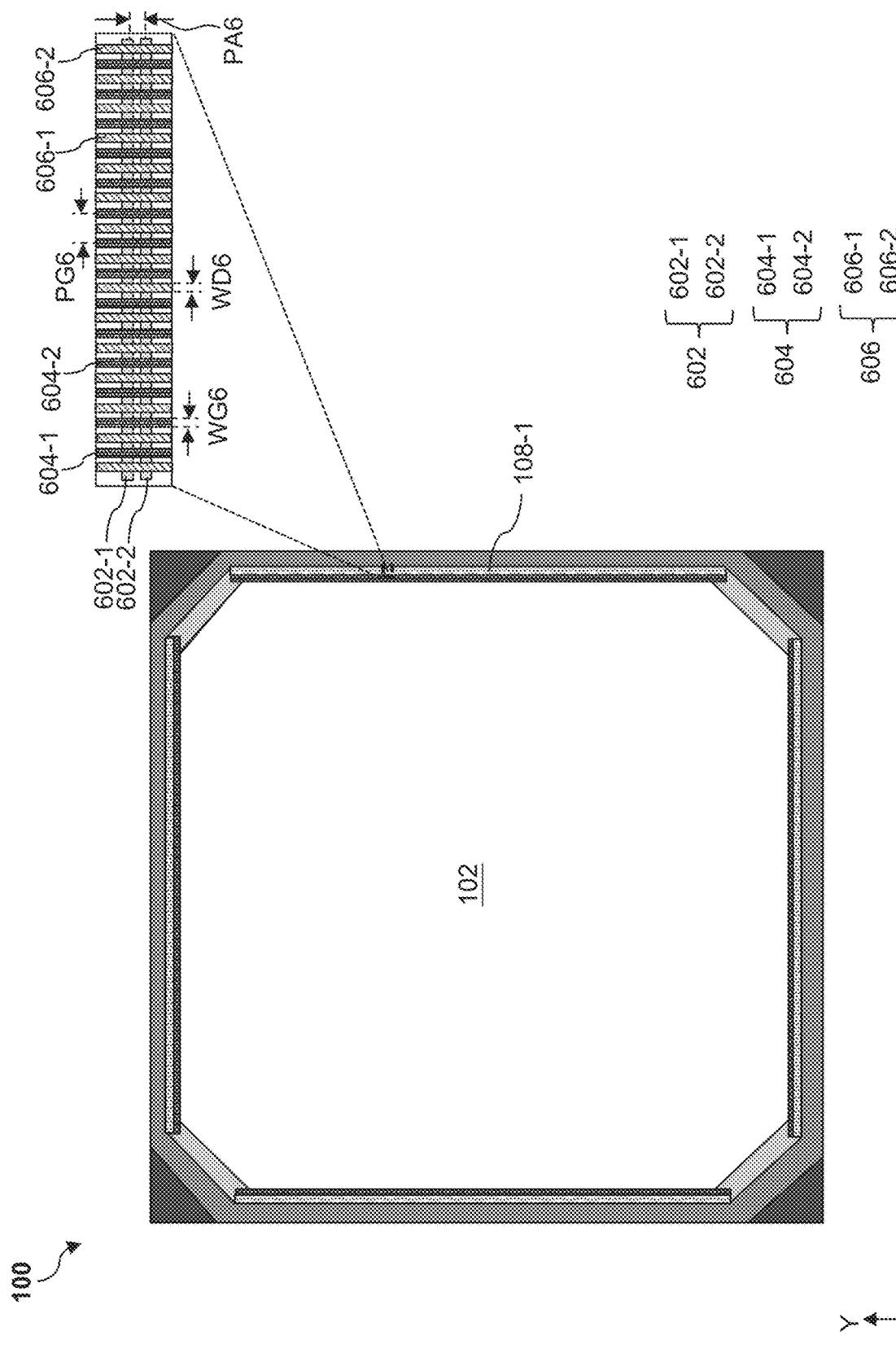
FIG. 6 illustrates an enlarged fragmentary top view of a second buffer portion of the seal structure of the semiconductor structure in FIG. 1, according to one or more aspects of the present disclosure.

Reference is then made to FIG. 6, which includes an enlarged fragmentary top view of the second buffer portion 108-1 in the buffer region 105. For illustration purposes, the second buffer portion 108-1 is shown in FIG. 6, and similar descriptions apply to the other three second buffer portions 108-2, 108-3 and 108-4. In embodiments represented in FIG. 6, the second buffer portion 108-1 includes active regions 602 (e.g., active regions 602-1 and 602-2) extending lengthwise along the X direction, gate structures 604 (e.g., gate structures 604-1 and 604-2) extending lengthwise along the Y direction, and source/drain contacts 606 (e.g., source/drain contacts 606-1 and 606-2) extending lengthwise along the Y direction. In embodiments represented in FIG. 6, the active regions 602 have an active region pitch PA6 along the Y direction, the gate structures 604 have a gate pitch PG6 along the X direction. Each active region 602 has an active region width, each gate structure 604 has a gate width WG6 along the X direction. The gate width WG6 is greater than or equal to the gate width WG1 and is smaller than the gate width WG5. That is, WG1≤WG6<WG5. In some embodiments, similar dimensional relationships also apply to the gate pitches, source/drain contact widths, and active region pitches in the device region 102, the second buffer portion 108-1, and the first buffer portion 110-1. That is, PG1≤PG6<PG5, WD1≤WD6<WD5, and PA1≤PA6<PA5. In an embodiment, a pitch difference between the gate pitch PG1 and the gate pitch PG6 is smaller than a pitch difference between the gate pitch PG1 and the gate pitch PG5. A pitch difference between the gate pitch PG1 and the gate pitch PG5 is smaller than a pitch difference between the gate pitch PG1 and the gate pitch PG4.

Since devices formed in the second buffer portion 108-1 will not be used to form circuits, and due to the dimensions of the devices in the second buffer portion 108-1 and process limitations (e.g., photolithography limitations), the active regions 602, the gate structures 604, and the source/drain contacts 606 may be uniformly segmented. Detailed description of the segmentations of the gate structures 604 would be further described with reference to FIGS. 7-8. Besides the dimensional differences, the structure, and compositions of the semiconductor device in the second buffer portion 108-1 may be in a way similar to those of the semiconductor device 200 in the device region 102, descriptions related to a cross-sectional view of the semiconductor device and compositions in the second buffer portion 108-1 are omitted for reason of simplicity.

Figure 7:
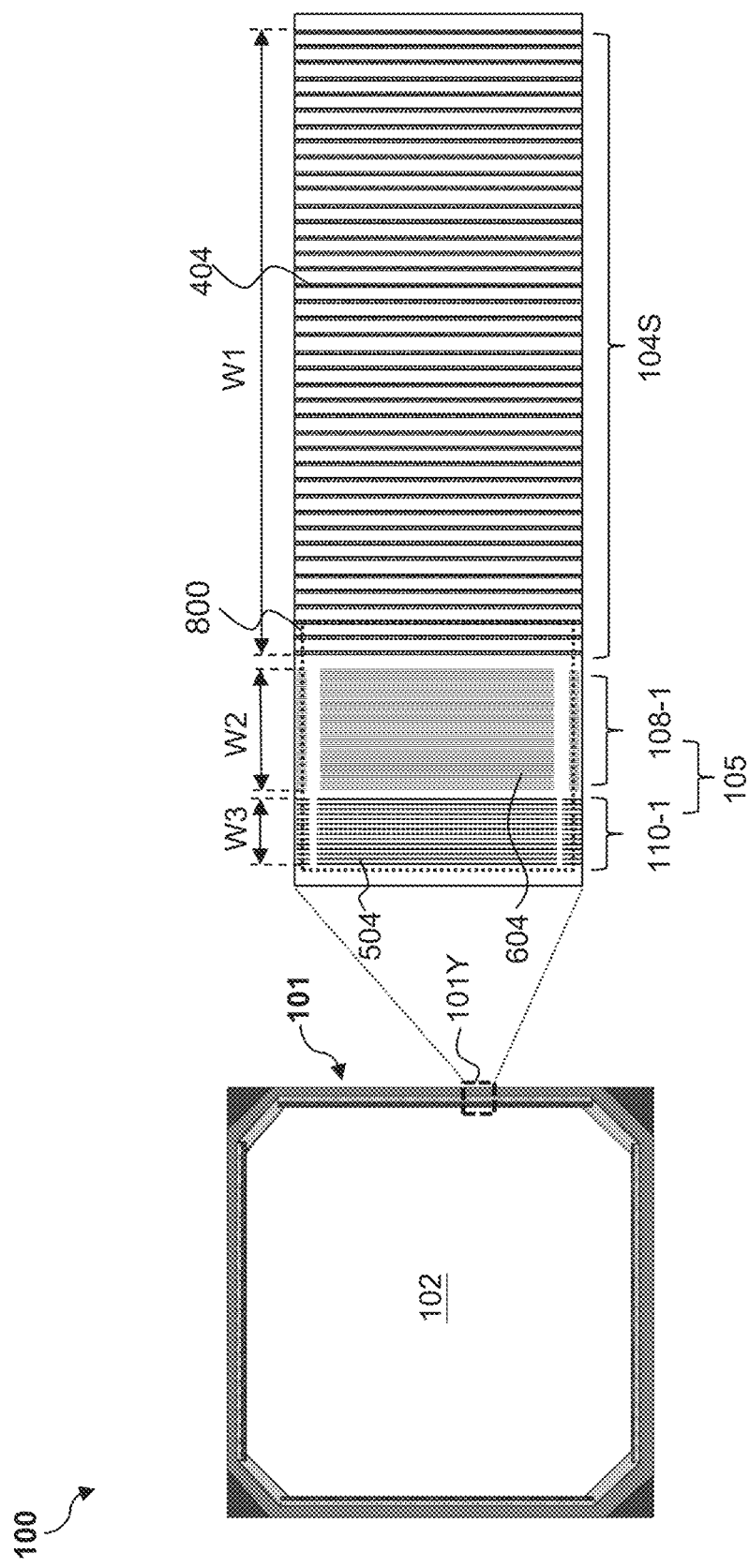
FIG. 7 illustrates an enlarged fragmentary top view of gate structures in a side portion of the seal structure of the semiconductor structure in FIG. 1, according to one or more aspects of the present disclosure.

Reference is then made to FIG. 7, which illustrates an enlarged fragmentary top view of a portion 101Y of the seal structure 101 that extends lengthwise along the Y direction. For reason of simplicity, only gate structures in the portion 101Y are shown in FIG. 7. It is understood that the portion 101Y also includes active regions (e.g., active regions 402, 502, and 602 shown in FIGS. 4, 5, and 6) and source/drain contacts (e.g., source/drain contacts 406, 506, 606 shown in FIGS. 4, 5, and 6).

In an embodiment, the gate width WG5 of the gate structure 504 in the first buffer portion 110-1 is substantially equal to the gate width WGmax and may be between about 40 nm and 60 nm to provide a buffer between the device region 102 and the outer ring 104; the gate width WG4 of the gate structure 404 in the outer ring 104 may be about twice of the gate width WGmax (i.e., 2*WGmax) to provide a satisfactory protection for the device region 102; the gate width WG6 of the gate structure 604 in the second buffer portion 108-1 is substantially equal to the gate width WGmin and may be between about 1 nm and about 5 nm to increase the average pattern density of the buffer region 105. Due to the dimensional relationships of the gate structures, devices in the outer ring 104 may be the least fragile devices in the semiconductor structure 100, and the second buffer portion 108-1 (and devices in the device region 102, in some embodiments) may be the most fragile devices and is protected by both the first buffer portion 110-1 and the outer ring 104. In some implementations, the gate width WG1 of the gate structure 204 in the device region 102 may be substantially equal to the gate width WGmin to provide a satisfactory functional density. In some other implementations, the gate width WG1 of the gate structure 204 in the device region 102 may be substantially equal to the gate width WGmax to provide another satisfactory functional density. In either implementation, the arrangement of the gate structures in the seal structure 101 may provide satisfactory protection and have a satisfactory pattern density to reduce reliability issues associated with the CMP loading.

In embodiments represented in FIG. 7, the straight portion 104S of the outer ring 104 spans a width W1 along the X direction, the second buffer portion 108-1 spans a width W2 along the X direction, and the first buffer portion 110-1 spans a width W3 along the X direction. W1 is greater than both W2 and W3 such that the seal structure 101 would provide a satisfactory protection for the device region 102. In an embodiment, a ratio of the width W1 to a total width (i.e., W2+W3) of the buffer region 105 in the portion 101Y (i.e., W1/(W2+W3)) may be between about 1 and about 5 to such that the seal structure 101 would provide satisfactory protection while ensuring that there is enough real estate for the buffer region 105. In embodiments represented in FIG. 7, the width W2 is greater than the width W3 to meet design rules while increasing the average pattern density in the buffer region 105. In an embodiment, a ratio of the width W2 to the width W3 (i.e., W2/W3) may be between about 1.5 and about 3

Figure 8:
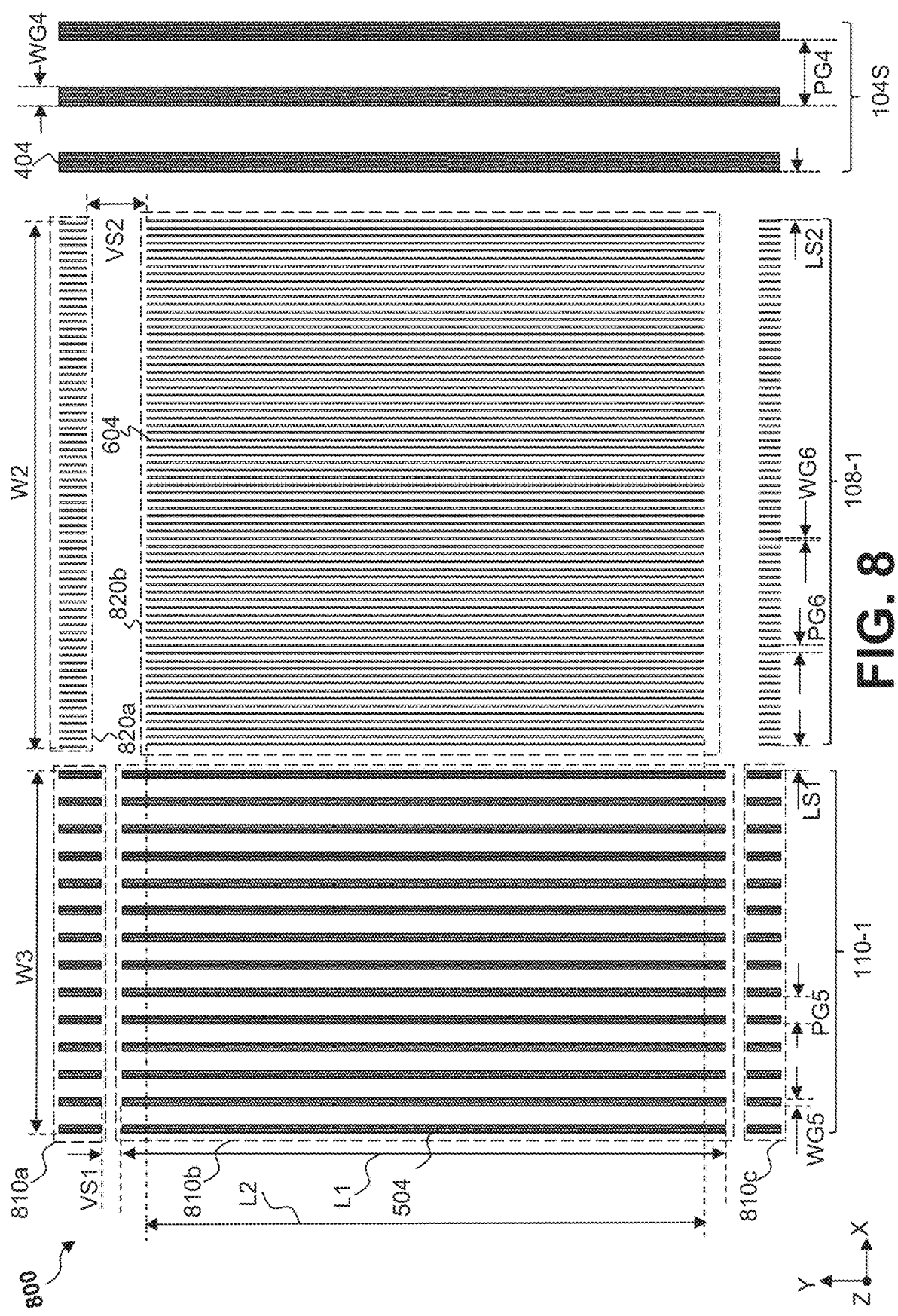
FIG. 8 illustrates an enlarged fragmentary top view of a portion of the gate structures in the side portion in FIG. 7, according to one or more aspects of the present disclosure.

A region 800 of the portion 101Y of the seal structure 101 is enlarged and shown in FIG. 8. It is noted that, for reason of simplicity, only gate structures in the region 800 are shown in FIG. 8, and active regions (e.g., active regions 402, 502, and 602) and source/drain contacts (e.g., source/drain contacts 406, 506, 606) are omitted. As shown in FIG. 8, the first buffer portion 110-1 is spaced apart from the second buffer portion 108-1 by a spacing LS1, and the second buffer portion 108-1 is spaced apart from the straight portion 104S of the outer ring 104 by a spacing LS2. As described above with references to FIGS. 4-6, the gate width WG4 in the straight portion 104S of the outer ring 104 is greater than the gate width WG5 in the first buffer portion 110-1, and the gate width WG5 in the first buffer portion 110-1 is greater than the gate width WG6 in the second buffer portion 108-1. That is, a dimensional difference between the gate width WG4 and the gate width WG6 (i.e., WG4−WG6) is greater than a dimensional difference between the gate width WG5 and the gate width WG6 (i.e., WG5−WG6). To protect the fragile devices in the second buffer portion 108-1 from being substantially damaged during fabrication processes such as CMP process, the spacing LS2 is greater than the spacing LS1.

As described above with references to FIGS. 4-6, the gate structures 404 of the outer ring 104 extends continuously surrounding the buffer region 105 and the device region 102, the gate structures 504 of the first buffer portion 110-1, the gate structures 604 of the second buffer portion 108-1 are segmented due to process limitations (e.g., photolithography limitations) and morphology considerations. More specifically, as shown in FIG. 8, the first buffer portion 110-1 includes multiple segmented portions such as segmented portions 810a, 810b, and 810c. Each of the segmented portions 810a-810c extends lengthwise along the Y direction, and the segmented portions 810a-810c are substantially vertically aligned. Two adjacent segmented portions (such as segmented portions 810a and 810b) are separated by a spacing VS1. Each of the segmented portions 810a-810c includes a number of the gate structures 504 extending lengthwise along the Y direction, and each gate structure 504 includes a length L1 in the Y direction and the width WG5 in the X direction.

The second buffer portion 108-1 includes multiple segmented portions such as segmented portions 820a and 820b. The segmented portions 820a and 820b extend lengthwise along the Y direction and are substantially vertically aligned. Two adjacent segmented portions (such as segmented portions 820a and 820b) are separated by a spacing VS2. Each of the segmented portions 820a and 820b includes a number of the gate structures 604 each extending lengthwise along the Y direction, and each gate structure 604 includes a length L2 in the Y direction and the width WG6 in the X direction. Since the components in the second buffer portion 108-1 have smaller dimensions (e.g., WG6<WG5) and thus are more fragile than those in the first buffer portion 110-1, the spacing VS2 is greater than the spacing VS1, and the length L2 is smaller than the length L1. As shown in FIG. 8, a gate pattern density (i.e., the number of gate structures in a predetermined area) of the second buffer portion 108-1 is greater than a gate pattern density of the first buffer portion 110-1, and the gate pattern density of the first buffer portion 110-1 is greater than a gate pattern density of the outer ring 104. By forming the second buffer portion 108-1 that has a greater gate pattern density, an average gate pattern density of the buffer region 105 may be increased, leading to a smaller pattern density difference between the buffer region 105 and the device region 102, thereby reducing reliability issues associated with CMP loading and increasing the reliability of the semiconductor structure 100. In addition, the second buffer portion 108-1 that includes components having smaller dimensions is disposed between the first buffer portion 110-1 and the outer ring 104 that have components in larger dimensions and are less fragile, the fragile components in the second buffer portion 108-1 may be protected by the first buffer portion 110-1 and the outer ring 104.

Figure 13:
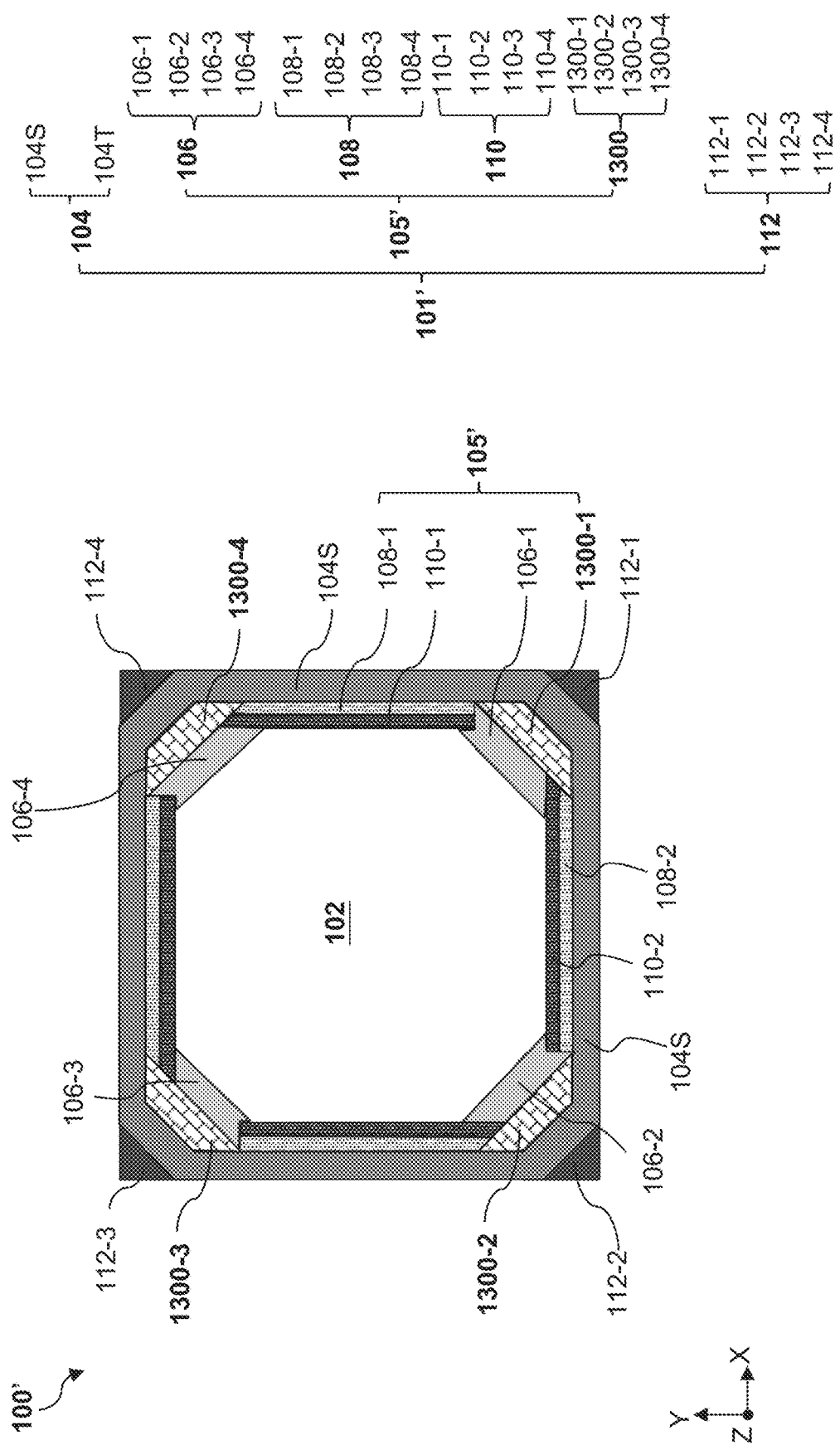
FIG. 13 illustrates a top view of another exemplary semiconductor structure that includes a device region and a seal structure around the device region, according to one or more aspects of the present disclosure.

Reference is now made to FIG. 9, which illustrates an enlarged top view of an inner corner area 106. For illustration purposes, the inner corner area 106-1 is shown in FIG. 9, and similar descriptions apply to the other three inner corner areas 106-2, 106-3 and 106-4. In embodiments represented in FIG. 9, a top view of the inner corner area 106-1 includes a polygon shape. More specifically, the polygon shape includes a main portion 910 that resembles an isosceles trapezoid and two auxiliary regions 920 and 930 adjacent to the main portion 910. Each of the two auxiliary regions 920 and 930 resembles a right trapezoid shape and includes two right-angle sides (such as right-angle side 920r) and a non-right-angle side (such as side 920s). The shape of the top view of the inner corner area 106-1 is just an example, and a top view of the inner corner area 106-1 may include other shapes. For example, due to different configurations of the seal structure 101, a shape of the top view of the inner corner area 106-1 shown in FIG. 13 is different from that shown in FIG. 9. The buffer region 105 is disposed adjacent to the right-angle side 920r of the auxiliary region and a side of the main portion 910. The inner corner area 106-1 includes active regions 902 (e.g., active regions 902-1 and 902-2) extending along the X direction, gate structures 904 (e.g., gate structures 904-1 and 904-2) extending along the Y direction, and source/drain contacts 906 (e.g., source/drain contacts 906-1 and 906-2) extending along the Y direction. The active regions 902 are disposed at an active region pitch PA9 along the Y direction, the gate structures 904 are disposed at a gate pitch PG9 along the X direction, each of the gate structures 904 has a gate width WG9 along the X direction, and each of the source/drain contacts 906 has a width WD9 along the X direction. A cross-sectional view of a semiconductor device, structure and compositions of the semiconductor device in the inner corner area 106-1 are a way similar to those of the semiconductor device in the device region 102, and repeated description is omitted for reason of simplicity.

Figure 10:
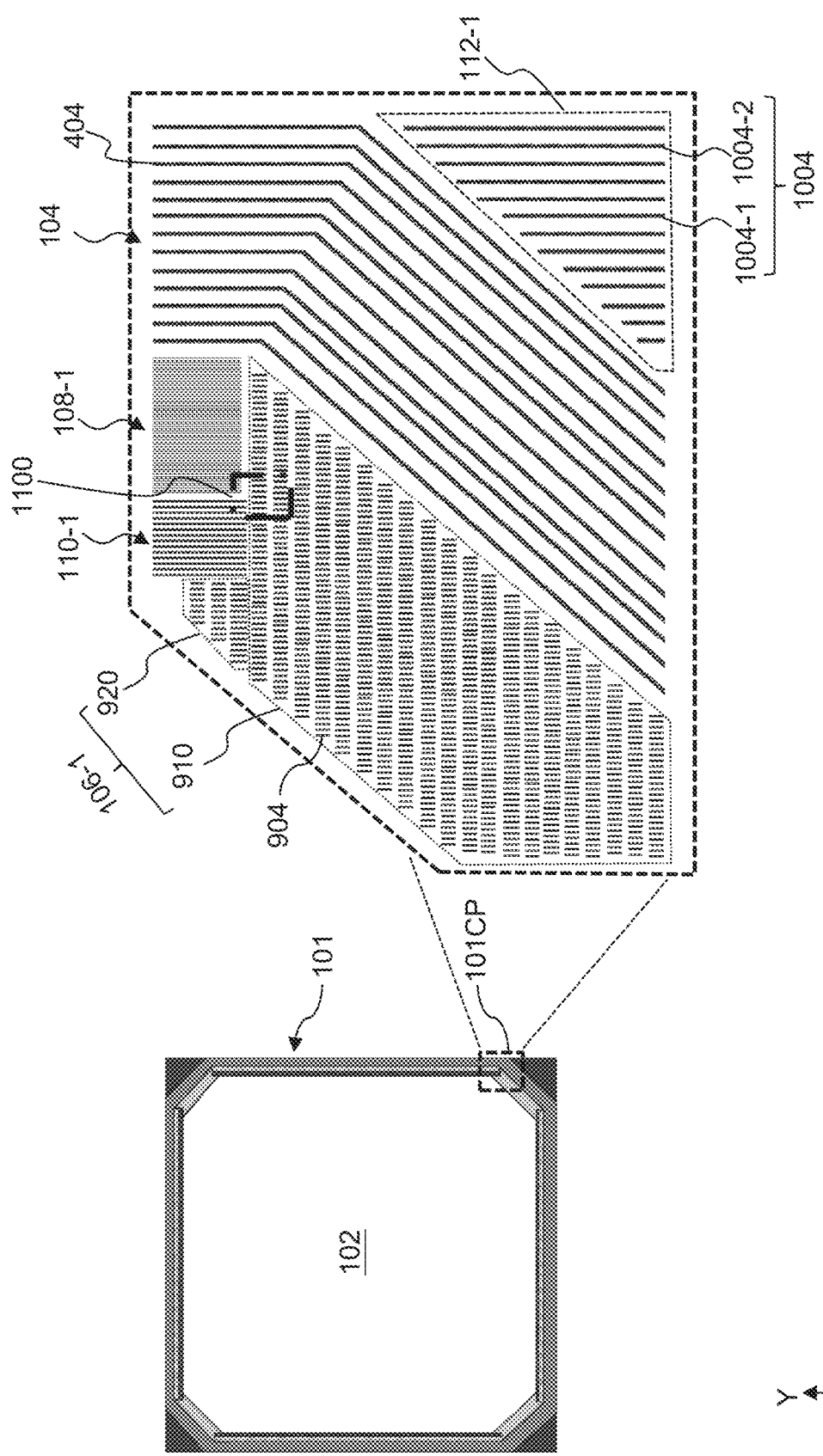
FIG. 10 illustrates an enlarged fragmentary top view of gate structures in a corner portion of the seal structure of the semiconductor structure in FIG. 1, according to one or more aspects of the present disclosure.

Reference is now made to FIG. 10, which illustrates an enlarged top view of a corner portion 101CP of the seal structure 101. As shown in FIG. 10, the enlarged top view of the corner portion 101CP includes a part of the first buffer portion 110-1, a part of the second buffer portion 108-1, a part of the outer ring 104, a part of the inner corner area 106-1, and a part of the outer corner area 112-1. For reason of simplicity, only gate structures in the corner portion 101CP are shown, and active regions and source/drain contacts are omitted.

The outer corner area 112-1 includes a number of gate structures (e.g., gate structures 1004-1 and 1004-2) extending lengthwise along the Y direction. In some other embodiments, the outer corner area 112-1 may include a number of gate structures extending lengthwise along the X direction. In some other implementations, the outer corner area 112-1 may include a number of gate structures extending lengthwise along a direction that is different from the X direction and the Y direction. In embodiments represented in FIG. 10, a top view of the outer corner area 112-1 resembles a right triangle, and each two adjacent gate structures in the outer corner area 112-1 have different lengths along the Y direction. The gate structures (e.g., gate structures 1004-1 and 1004-2) in the outer corner area 112-1 have a gate pitch that is substantially equal to the gate pitch PG4 of the gate structures 404 in the outer ring 104. Along the X direction, a width of each of the gate structures (e.g., gate structures 1004-1 and 1004-2) in the outer corner area 112-1 is substantially equal to a width WG4 of the gate structure 404 in the outer ring 104. In an embodiment, a pattern density of gate structures 1004 in the outer corner area 112-1 is substantially equal to a pattern density of gate structures 404 in the outer ring 104 and is less than a pattern density of gate structures 904 in the inner corner area 106-1.

Figure 11:
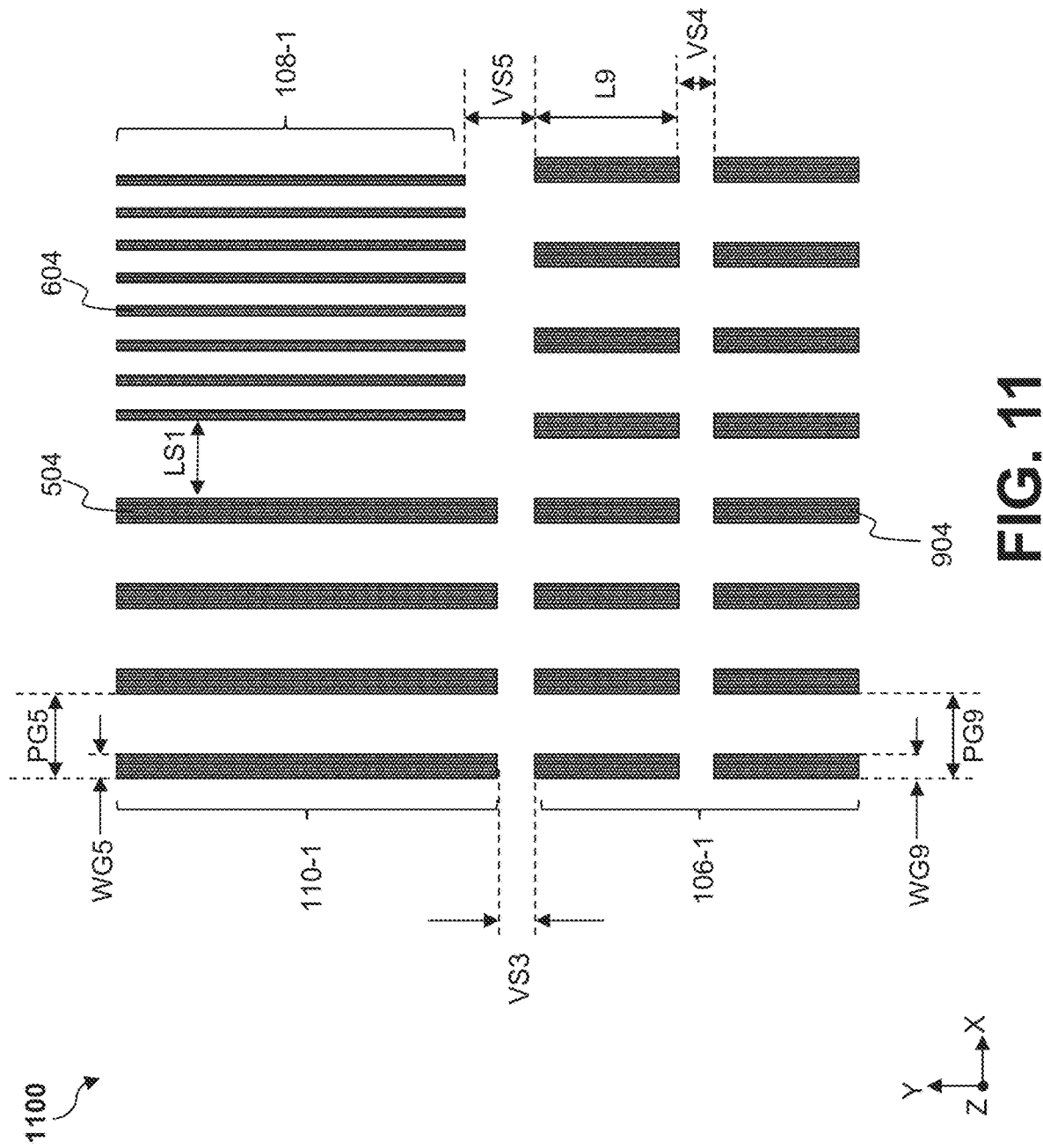
FIG. 11 illustrates an enlarged fragmentary top view of a portion of the gate structures in the corner portion in FIG. 10, according to one or more aspects of the present disclosure.

A region 1100 of the corner portion 101CP is enlarged and illustrated in FIG. 11. As shown in FIG. 11, the gate structures 904 in the inner corner area 106-1 have the gate pitch PG9, and each of the gate structures 904 has the width WG9 along the X direction. In an embodiment, the gate pitch PG9 is equal to the gate pitch PG5 of gate structures 504 in the first buffer portion 110-1, and the width WG9 is equal to the width WG5 of gate structures 504 in the first buffer portion 110-1. Since the inner corner area 106-1 is disposed adjacent to the inner corner of the outer ring 104, each of the gate structures 904 in the inner corner area 106-1 have a length L9 that is much smaller than the length L1 (shown in FIG. 8) of each of the gate structures 504 in the first buffer portion 110-1. In an embodiment, a ratio of the length L1 to the length L9 (i.e., L1/L9) may be between about 5 and about 17.

Still referring to FIG. 11, the first buffer portion 110-1 is vertically spaced apart from the inner corner area 106-1 by a spacing VS3. Each two adjacent gate structures 904 in the inner corner area 106-1 are vertically spaced by a spacing VS4. In an embodiment, the spacing VS4 is substantially equal to the spacing VS3. The second buffer portion 108-1 is vertically spaced apart from the inner corner area 106-1 by a spacing VS5. Since the dimensions (e.g., gate width, gate pitch) of the semiconductor devices in the second buffer portion 108-1 are smaller than those in the inner corner area 106-1, the spacing VS5 may be greater than the spacing VS3 such that small-dimension semiconductor devices in the second buffer portion 108-1 would not be substantially damaged during various fabrication processes (e.g., CMP).

Figure 12:
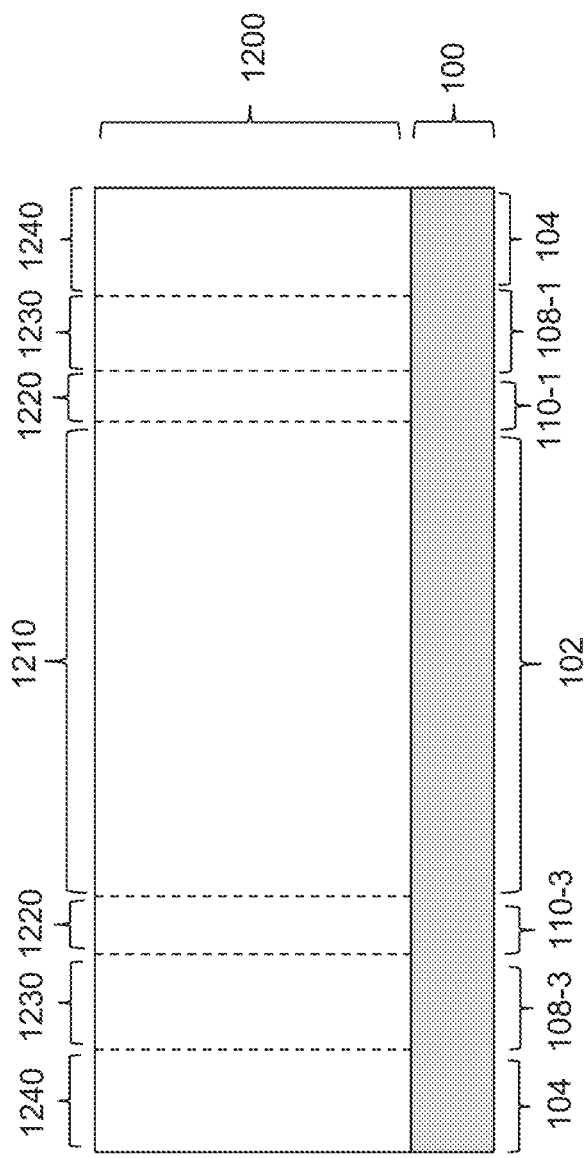
FIG. 12 illustrates a cross-sectional view of an interconnect structure disposed on the semiconductor structure in FIG. 1, according to one or more aspects of the present disclosure.

FIG. 12 illustrates a cross-sectional view of an interconnect structure 1200 disposed on the semiconductor structure 100 in FIG. 1. The interconnect structure 1200 may include more than 8 metal layers, such as between 9 metal layers and 14 metal layers. Each of the metal layers includes conductive lines embedded in an intermetal dielectric (IMD) layer. The interconnect structure 1200 also includes contact vias to vertically interconnect conductive lines in different metal layers. Conductive lines and contact vias in the interconnect structure 1200 may be collectively referred to as conductive features. The IMD layer may include materials such as tetraethylorthosilicate (TEOS) oxide, un-doped silicate glass, or doped silicon oxide, borophosphosilicate glass (BPSG), fused silica glass (FSG), phosphosilicate glass (PSG), boron doped silicon glass (BSG), silicon oxycarbide, and/or other suitable dielectric materials. The conductive lines and contact vias may include copper (Cu), titanium nitride (TiN), tungsten (W), or ruthenium (Ru).

In an embodiment, the interconnect structure 1200 has a first region 1210 that includes conductive features electrically connected to features (e.g., gate structures, source/drains) in the device region 102, a second region 1220 surrounding the first region 1210 and having conductive features electrically connected to features in the first buffer portion 110, a third region 1230 surrounding the second region 1220 and having conductive features electrically connected to features in the second buffer portion 120, and a fourth region 1240 surrounding the third region 1230 and having conductive features electrically connected to features in the outer ring 104. In an embodiment, a pattern density of the conductive features in the second region 1220 is less than a pattern density of the conductive features in the third region 1230 and is greater than a pattern density of the conductive features in the fourth region 1240. In an embodiment, a pattern density of the conductive features in the first region 1210 may be ranged between a pattern density of the conductive features in the second region 1220 and a pattern density of the conductive features in the third region 1230.

In the above embodiments described with reference to FIG. 1 and FIG. 10, each of the inner corner areas 106 is disposed directly adjacent to the respective turning portion 104T of the seal ring 104. In some other implementations, the configurations of the inner corner areas 106 and turning portions 104T of the seal ring 104 may be different. For example, FIG. 13 illustrates a top view of another exemplary semiconductor structure 100' that includes the device region 102 and a seal structure 101' around the device region 102. The seal structure 101' is in a way similar to the seal structure 101 described with reference to FIGS. 1-11, except that the seal structure 101' also includes a number of middle corner areas 1300 (e.g., a middle corner area 1300-1, a middle corner area 1300-2, a middle corner area 1300-3, and a middle corner area 1300-4) disposed between the inner corner areas 106 and the turning portions 104T of the seal ring 104. That is, the inner corner areas 106 are spaced apart from the turning portions 104T of the seal ring 104 by the middle corner areas 1300, and the middle corner areas 1300 are spaced apart from the outer corner areas 112 by the turning portions 104T of the seal ring 104.

Figure 14:
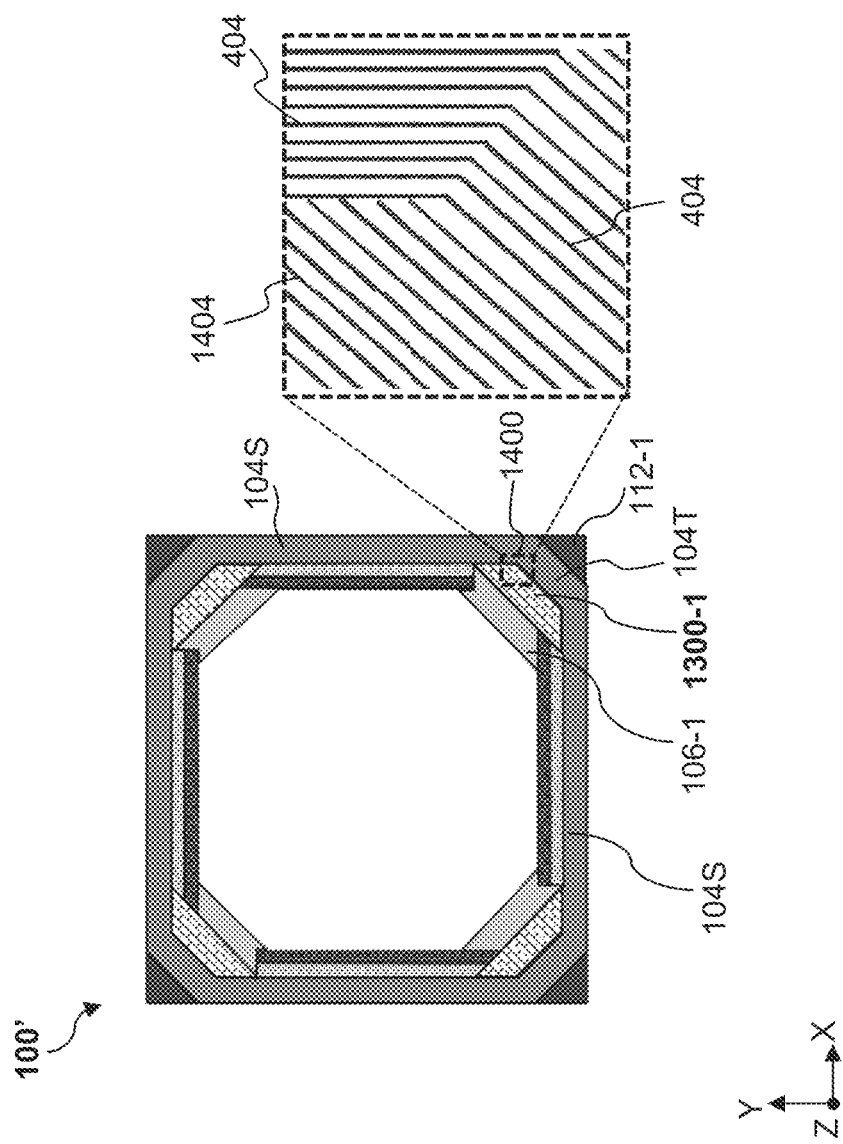
FIG. 14 illustrates an enlarged fragmentary top view of gate structures in a corner portion of the seal structure of the semiconductor structure in FIG. 13, according to one or more aspects of the present disclosure.

FIG. 14 illustrates an enlarged fragmentary top view of gate structures of a portion 1400 of the seal structure 101. As shown in FIG. 14, the enlarged top view of the portion 1400 includes a part of the middle corner area 1300-1 and a part of the straight portion 104S and a part of the turning portion 104T of the outer ring 104. For reason of simplicity, only gate structures in the portion 1400 are shown, and active regions and source/drain contacts are omitted. In embodiments represented in FIG. 14, the middle corner area 1300-1 includes a number of gate structures (e.g., gate structures 1404). Those gate structures 1404 extend lengthwise along a direction that is parallel to the longitudinal direction of portions of the gate structures 404 in the turning portion 104T. The gate structures 1404 in the middle corner area 1300-1 have a gate pitch that is substantially equal to the gate pitch PG4 of the gate structures 404 in the outer ring 104. Each of the gate structures 1404 has a gate width that is substantially equal to a width WG4 of the gate structure 404 in the outer ring 104. In an embodiment, a pattern density of gate structures 1404 in the middle corner area 1300-1 is substantially equal to a pattern density of gate structures 404 in the outer ring 104 and is less than a pattern density of gate structures 904 in the inner corner area 106-1.

Although not intended to be limiting, the present disclosure provides many benefits. For example, a semiconductor structure includes a device region and a seal structure surrounding the device region. By forming the seal structure that has a buffer region and a seal ring region and disposing the buffer region between the device region and the seal ring region, the seal ability of the seal structure is enhanced. Furthermore, by forming the buffer region that includes a first buffer portion having a first pattern density and a second buffer portion having a pattern density greater than the first pattern density, an average pattern density of the buffer region is increased, leading to a reduced pattern density difference between device region and the buffer region. As a result, reliability issues associated with the CMP loading may be reduced, and the reliability of the semiconductor structure may be increased.

The present disclosure provides for many different embodiments. Semiconductor structures and methods of fabrication thereof are disclosed herein. In one exemplary aspect, the present disclosure is directed to a semiconductor structure. The semiconductor structure includes a device region including a plurality of first gate structures having a gate pitch P1 and a buffer region disposed adjacent to the device region. The buffer region includes a first portion and a second portion spaced apart from the device region by the first portion. The first portion includes a plurality of second gate structures having a gate pitch P2, and the second portion includes a plurality of third gate structures having a gate pitch P3. The semiconductor structure also includes a ring region surrounding the device region and spaced apart from the device region by the buffer region, the ring region comprising a plurality of fourth gate structures having a gate pitch P4. A difference between the gate pitch P1 and the gate pitch P2 is smaller than a difference between the gate pitch P1 and the gate pitch P4.

In some embodiments, the gate pitch P3 may be smaller than the gate pitch P2. In some embodiments, each of the plurality of second gate structures and each of the plurality of third gate structures may extend lengthwise along a first direction, each of the plurality of second gate structures has a length L1 along the first direction, and each of the plurality of third gate structures has a length L2 along the first direction, and the length L2 may be smaller than the length L1. In some embodiments, each of the plurality of second gate structures has a width W1 along a second direction substantially perpendicular to the first direction, each of the plurality of third gate structures has a width W2 along the second direction, the width W2 may be smaller than the width W1. In some embodiments, each of the plurality of fourth gate structures has a width W3 along the second direction, the width W2 may be smaller than the width W3. In some embodiments, each of plurality of fourth gate structures may be a continuous gate structure and may include a first portion extending lengthwise along the first direction and a second portion extending lengthwise along the second direction.

In another exemplary aspect, the present disclosure is directed to a semiconductor structure. The semiconductor structure includes a device region having a first side extending lengthwise along a first direction, and a seal structure surrounding the device region. The seal structure includes a first inner region including a first portion disposed adjacent to the first side of the device region, the first portion of the first inner region includes a first plurality of first gate structures extending lengthwise along the first direction, each of the first plurality of first gate structures has a width W1 along a second direction substantially perpendicular to the first direction. The seal structure also includes a second inner region spaced apart from the device region by the first inner region, a first portion of the second inner region includes a first plurality of second gate structures extending lengthwise along the first direction, and each of the first plurality of second gate structures has a width W2 along the second direction, the width W2 is smaller than the width W1.

In some embodiments, the first portion of the first inner region spans a width W3 along the second direction, the first portion of the second inner region spans a width W4 along the second direction, the width W3 may be smaller than the width W4. In some embodiments, the first portion of the first inner region may also include a second plurality of first gate structures aligning with the first plurality of first gate structures along the first direction, the second plurality of first gate structures may be spaced apart from the first plurality of first gate structures by a spacing S1. In some embodiments, the first portion of the second inner region may also include a second plurality of second gate structures aligning with the first plurality of second gate structures along the first direction, the second plurality of second gate structures may be spaced apart from the first plurality of second gate structures by a spacing S2, and the spacing S1 may be smaller than the spacing S2. In some embodiments, the first inner region may also include a second portion disposed adjacent to a second side of the device region, the second portion of the first inner region may include a second plurality of first gate structures extending lengthwise along the second direction, the second plurality of first gate structures may be spaced apart from the first plurality of first gate structures. The second inner region may also include a second portion spaced apart from the device region by the second portion of the first inner region, the second portion of the second inner region may include a second plurality of second gate structures extending lengthwise along the second direction, the second plurality of second gate structures may be spaced apart from the first plurality of second gate structures. In some embodiments, the seal structure may also include an inner corner region that having a first inner corner. The second plurality of first gate structures may be spaced apart from the first plurality of first gate structures by the first inner corner, and the second plurality of second gate structures may be spaced apart from the first plurality of second gate structures by the first inner corner. In some embodiments, the first inner corner may include a plurality of third gate structures extending lengthwise along the first direction, and a length L3 of each of the plurality of third gate structures along the first direction may be smaller than a length L1 of each of the first plurality of first gate structures along the first direction. In some embodiments, the semiconductor structure may also include an outer ring surrounding the device region. The outer ring may be spaced apart from the device region by the inner corner region or a combination of the first inner region and the second inner region. In some embodiments, the outer ring may include a plurality of fourth gate structures, and each of the plurality of fourth gate structures may extend continuously along the second inner region and the inner corner region. In some embodiments, the width W1 may be smaller than a width W4 of each of the plurality of fourth gate structures along the second direction.

In yet another exemplary aspect, the present disclosure is directed to a semiconductor structure. The semiconductor structure includes a device region and a seal structure surrounding the device region. The seal structure includes a first inner region that comprises a plurality of first gate structures extending lengthwise along a first direction, a second inner region being spaced apart from the device region by the first inner region, and an outer ring region comprising a plurality of third gate structures. The second inner region includes a plurality of second gate structures extending lengthwise along the first direction, and a portion of the outer ring region is spaced apart from the first inner region by the second inner region. A gate pitch of the plurality of first gate structures is smaller than a gate pitch of the plurality of third gate structures.

In some embodiments, each of the plurality of first gate structures has a gate width W1 along a second direction substantially perpendicular to the first direction, each of the plurality of second gate structures has a gate width W2 along the second direction, and the gate width W1 may be greater than the gate width W2. In some embodiments, the second inner region is spaced apart from the first inner region by a spacing S1, the second inner region is spaced apart from the outer ring region by a spacing S2, the spacing S1 may be smaller than the spacing S2. In some embodiments, a gate pitch of the plurality of second gate structures may be smaller than the gate pitch of the plurality of first gate structures.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a device region comprising a plurality of first gate structures having a gate pitch P1; and
a seal structure surrounding the device region, wherein the seal structure comprises:
a buffer region disposed adjacent to the device region, the buffer region comprises a first portion comprising a plurality of second gate structures having a gate pitch P2 and a second portion spaced apart from the device region by the first portion, the second portion comprises a plurality of third gate structures having a gate pitch P3, and
a ring region surrounding the device region and spaced apart from the device region by the buffer region, the ring region comprising a plurality of fourth gate structures having a gate pitch P4,
wherein a difference between the gate pitch P1 and the gate pitch P2 is smaller than a difference between the gate pitch P1 and the gate pitch P4.

2. The semiconductor structure of claim 1, wherein the gate pitch P3 is smaller than the gate pitch P2.

3. The semiconductor structure of claim 1, wherein each of the plurality of second gate structures and each of the plurality of third gate structures extend lengthwise along a first direction,
wherein each of the plurality of second gate structures has a length L1 along the first direction,
wherein each of the plurality of third gate structures has a length L2 along the first direction, the length L2 is smaller than the length L1.

4. The semiconductor structure of claim 3, wherein each of the plurality of second gate structures has a width W1 along a second direction substantially perpendicular to the first direction,
wherein each of the plurality of third gate structures has a width W2 along the second direction, the width W2 is smaller than the width W1.

5. The semiconductor structure of claim 4, wherein each of the plurality of fourth gate structures has a width W3 along the second direction, the width W2 is smaller than the width W3.

6. The semiconductor structure of claim 4, wherein each of plurality of fourth gate structures is a continuous gate structure and comprises a first portion extending lengthwise along the first direction and a second portion extending lengthwise along the second direction.

7. A semiconductor structure, comprising:
a device region having a first side extending lengthwise along a first direction; and
a seal structure surrounding the device region, the seal structure comprising a ring region comprising a plurality of gate structures and a buffer region disposed between the ring region and the device region, the buffer region comprising:
a first inner region including a first portion disposed adjacent to the first side of the device region, the first portion of the first inner region comprising a first plurality of first gate structures extending lengthwise along the first direction, wherein each of the first plurality of first gate structures has a first width along a second direction substantially perpendicular to the first direction, and
a second inner region spaced apart from the device region by the first inner region, wherein a first portion of the second inner region comprises a first plurality of second gate structures extending lengthwise along the first direction, and each of the first plurality of second gate structures has a second width along the second direction,
wherein the second width is smaller than the first width.

8. The semiconductor structure of claim 7,
wherein the first portion of the first inner region spans a third width along the second direction, the first portion of the second inner region spans a fourth width along the second direction,
wherein the third width is smaller than the fourth width.

9. The semiconductor structure of claim 7,
wherein the first portion of the first inner region further comprises a second plurality of first gate structures aligning with the first plurality of first gate structures along the first direction,
wherein the second plurality of first gate structures are spaced apart from the first plurality of first gate structures by a spacing S1.

10. The semiconductor structure of claim 9,
wherein the first portion of the second inner region further comprises a second plurality of second gate structures aligning with the first plurality of second gate structures along the first direction,
wherein the second plurality of second gate structures are spaced apart from the first plurality of second gate structures by a spacing S2, the spacing S1 is smaller than the spacing S2.

11. The semiconductor structure of claim 7,
wherein the first inner region further comprises a second portion disposed adjacent to a second side of the device region, the second portion of the first inner region comprising a second plurality of first gate structures extending lengthwise along the second direction, the second plurality of first gate structures are spaced apart from the first plurality of first gate structures,
wherein the second inner region further comprises a second portion spaced apart from the device region by the second portion of the first inner region, the second portion of the second inner region comprises a second plurality of second gate structures extending lengthwise along the second direction, wherein the second plurality of second gate structures are spaced apart from the first plurality of second gate structures.

12. The semiconductor structure of claim 11, wherein the seal structure further comprises:
an inner corner region comprising a first inner corner,
wherein the second plurality of first gate structures are spaced apart from the first plurality of first gate structures by the first inner corner, and the second plurality of second gate structures are spaced apart from the first plurality of second gate structures by the first inner corner.

13. The semiconductor structure of claim 12,
wherein the first inner corner comprises a plurality of third gate structures extending lengthwise along the first direction,
wherein a length L3 of each of the plurality of third gate structures along the first direction is smaller than a length L1 of each of the first plurality of first gate structures along the first direction.

14. The semiconductor structure of claim 13, wherein the ring region is spaced apart from the device region by the inner corner region or a combination of the first inner region and the second inner region.

15. The semiconductor structure of claim 14,
wherein each of the plurality of gate structures extends continuously along the second inner region and the inner corner region.

16. The semiconductor structure of claim 15,
wherein, the first width is smaller than a width of each of the plurality of gate structures along the second direction.

17. A semiconductor structure, comprising:
a device region; and
a seal structure surrounding the device region, the seal structure comprising:
  a buffer region adjacent to the device region and comprising a first inner region comprising a plurality of first gate structures extending lengthwise along a first direction and a second inner region being spaced apart from the device region by the first inner region, the second inner region comprising a plurality of second gate structures extending lengthwise along the first direction, and
  an outer ring region comprising a plurality of third gate structures, wherein a portion of the outer ring region is spaced apart from the first inner region by the second inner region,
  wherein a gate pitch of the plurality of first gate structures is smaller than a gate pitch of the plurality of third gate structures.

18. The semiconductor structure of claim 17,
wherein each of the plurality of first gate structures has a gate width W1 along a second direction substantially perpendicular to the first direction,
wherein each of the plurality of second gate structures has a gate width W2 along the second direction, and
the gate width W1 is greater than the gate width W2.

19. The semiconductor structure of claim 17,
wherein the second inner region is spaced apart from the first inner region by a spacing S1, the second inner region is spaced apart from the outer ring region by a spacing S2, the spacing S1 is smaller than the spacing S2.

20. The semiconductor structure of claim 17,
wherein a gate pitch of the plurality of second gate structures is smaller than the gate pitch of the plurality of first gate structures.

* * * * *